(12) United States Patent
Kataoka et al.

(10) Patent No.: US 8,674,384 B2
(45) Date of Patent: Mar. 18, 2014

(54) LIGHT EMITTING ELEMENT

(75) Inventors: Takashi Kataoka, Kanagawa-ken (JP);
Yukie Nishikawa, Fukuoka-ken (JP);
Hironori Yamasaki, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 13/048,046

(22) Filed: Mar. 15, 2011

(65) Prior Publication Data

US 2012/0104431 A1 May 3, 2012

(30) Foreign Application Priority Data

Nov. 2, 2010 (JP) ................................. 2010-246409

(51) Int. Cl.
*H01L 33/00* (2010.01)

(52) U.S. Cl.
USPC .......... 257/95; 257/79; 257/94; 257/E33.043; 257/E33.067; 257/E33.074

(58) Field of Classification Search
USPC ............... 257/79, 94, 95, E33.043, E33.067, 257/E33.074, 101, 102
See application file for complete search history.

(56) References Cited

U.S. PATENT DOCUMENTS 6,878,969 B2 * 4/2005 Tanaka et al. .................... 257/79
7,304,333 B2 * 12/2007 Niwa ............................ 257/197
7,449,722 B2 * 11/2008 Konno et al. .................... 257/94

2002/0098606 A1 * 7/2002 Nakamura et al. ............... 438/22
2003/0178626 A1 * 9/2003 Sugiyama et al. ............... 257/79
2009/0014734 A1 1/2009 Nishikawa et al.

FOREIGN PATENT DOCUMENTS

| CN | 1433088 A | 7/2003 |
|----|-----------|--------|
| CN | 1472826 A | 2/2004 |
| CN | 1909257 A | 2/2007 |
| JP | 2010-098234 | 4/2010 |

OTHER PUBLICATIONS

Taiwanese Office Action issued on Sep. 30, 2013 in corresponding TW Application No. 100108111, along with English translation.
Chinese Office Action issued on Dec. 3, 2013 in corresponding Chinese Application No. 201110070619.6, along with English translation.

* cited by examiner

*Primary Examiner* — S. V. Clark
*Assistant Examiner* — Jesse Y Miyoshi
(74) *Attorney, Agent, or Firm* — White & Case LLP

(57) ABSTRACT

According to one embodiment, a light emitting element includes a light emitting layer, a cladding layer, a current spreading layer, a second layer, and an electrode. The light emitting layer is capable of emitting emission light. The current spreading layer includes a surface processed layer and a first layer. The surface processed layer has a surface including convex portions and bottom portions provided adjacent to the convex portions. The first layer is provided between the surface processed layer and the cladding layer. The second layer is provided between the surface processed layer and the cladding layer and includes a region having an impurity concentration higher than an impurity concentration of the current spreading layer. The electrode is provided in a region of the surface of the surface processed layer where the convex portions and the bottom portions are not provided.

13 Claims, 4 Drawing Sheets

LIGHT EMITTING ELEMENT

CROSS-REFERENCE TO RELATED APPLICATIONS

This application is based upon and claims the benefit of priority from the prior Japanese Patent Application No. 2010-246409, filed on Nov. 2, 2010; the entire contents of which are incorporated herein by reference.

FIELD

Embodiments described herein relate generally to a light emitting element.

BACKGROUND

A light emitting element is increasingly required to have a higher output for the application to an illumination apparatus, a display device, a traffic lights, etc.

When a high concentration current spreading layer is provided between a light emitting layer and an electrode, carriers injected from the electrode is spread in a light emitting layer plane and a higher light output is emitted easily.

Further, when fine concave-convex structures are formed on the surface of the current spreading layer on the light emitting side, a light extraction efficiency is improved and a light output can be made further higher. In this case, by forming fine concave-convex structures using a dry etching method such as RIE (Reactive Ion Etching), it is possible to form the fine concave-convex structures having a size not more than the wavelength of the emitted light surely and also with increased productivity.

When the dry etching method is used, however, a crystal defect is easily caused in a processed area and an ion species sometimes intrudes into the light emitting layer. Thereby, the light output is sometimes degraded during long operation time.

DETAILED DESCRIPTION

In general, according to one embodiment, a light emitting element includes a light emitting layer, a cladding layer of a first conductivity type, a current spreading layer of the first conductivity type, a second layer of the first conductivity type, and an electrode. The light emitting layer is capable of emitting emission light. The current spreading layer includes a surface processed layer and a first layer. The surface processed layer has a surface including convex portions and bottom portions provided adjacent to the convex portions. The first layer is provided between the surface processed layer and the cladding layer. The second layer is provided between the surface processed layer and the cladding layer and includes a region having an impurity concentration higher than an impurity concentration of the current spreading layer. The electrode is provided in a region of the surface of the surface processed layer where the convex portions and the bottom portions are not provided. The cladding layer, the current spreading layer, and the second layer are provided on one surface side of the light emitting layer.

Hereinafter, embodiments of the invention will be described with reference to the drawings.

Figure 1A:
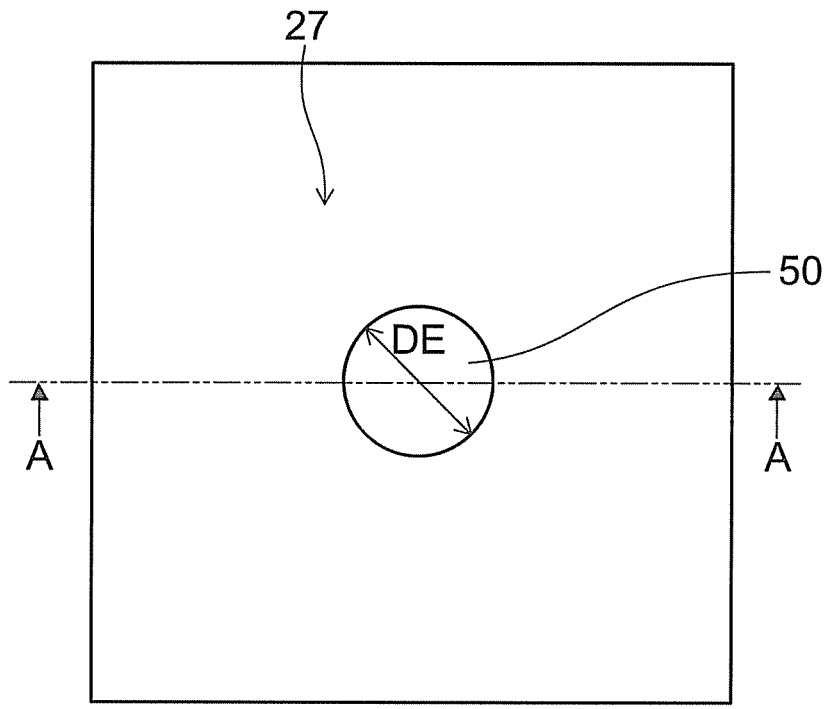
FIG. 1A is a schematic plan view of a light emitting element according to a first embodiment.
Figure 1B:
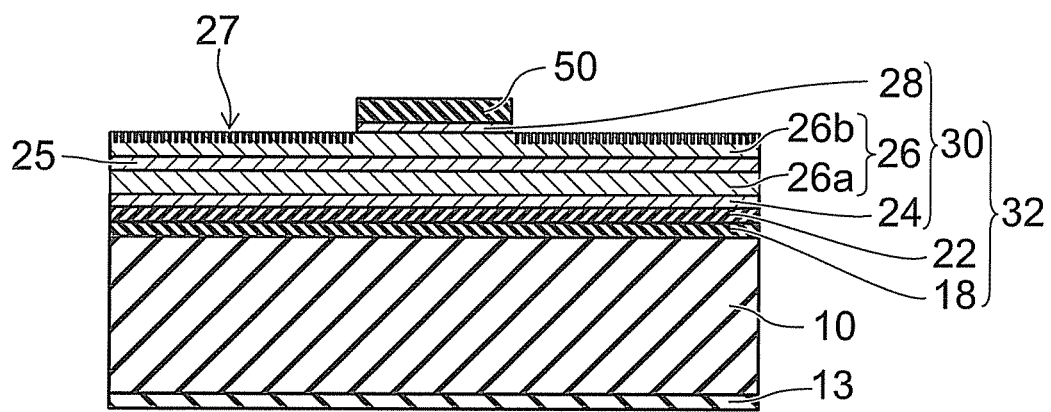
FIG. 1B is a schematic cross-sectional view taken along line A-A.

FIG. 1A is a schematic plan view of a light emitting element according to a first embodiment of the invention, and FIG. 1B is a schematic cross-sectional view taken along line A-A.

The light emitting element includes a substrate 10, a stacked body 32 provided on the substrate 10, a first electrode 50 provided on the stacked body 32, and a second electrode 13 provided on the rear surface of the substrate 10.

The stacked body 32 has a light emitting layer 22, a first conductivity type layer 30 provided on the light emitting layer 22, and a second conductivity type layer 18 provided under the light emitting layer 22. The first conductivity type layer 30 includes a cladding layer 24, a current spreading layer 26, a second layer 25, and a contact layer 28 on one surface side of the light emitting layer 22. Further, the second conductivity type layer 18 may include a cladding layer contacting the light emitting layer 22.

The light emitting layer 22 can be made of a material such as $In_x(Ga_yAl_{1-y})_{1-x}P$ ($0 \leq x \leq 1$ and $0 \leq y \leq 1$), $Al_xGa_{1-x}As$ ($0 \leq x \leq 1$), and $In_xGa_yAl_{1-x-y}N$ ($0 \leq x \leq 1$, $0 \leq y \leq 1$, and $x+y \leq 1$). Further, the substrate can be made of GaAs, GaP, etc. In the case where wafer bonding is performed, the substrate 10 may be made of GaP, Si, a sapphire, etc.

The current spreading layer 26 includes a surface processed layer 26b having a surface provided with concave-convex structures 27 and a first layer 26a provided between the surface processed layer 26b and the cladding layer 24, and has a first conductivity type. The second layer 25 is provided between the surface processed layer 26b and the cladding layer 24. Further, the second layer 25 includes one of a region having an impurity concentration higher than an impurity concentration of the current spreading layer 26 and a region having a dopant different from the dopant of the current spreading layer 26, and has the first conductivity type.

Alternatively, the second layer 25 may include a region including a constituent element different from the constituent element of the current spreading layer 26 and have the first conductivity type.

The first electrode 50 is provided in a region of the surface of the surface processed layer 26b where the concave-convex portions 27 is not provided and injects carriers to the current spreading layer 26. The injected carriers are diffused and the carriers (current) are spread in the plane of the light emitting layer 22. Here, the first electrode 50 is configured to have a circular shape having a diameter DE of 120 µm or the like. The shape of the first electrode 50 is not limited to the circle, and may be a rectangle, an ellipsoid, a polygon, and a combination thereof. Further, the first electrode 50 may have a thin wire electrode additionally. For example, when one or multiple thin wire electrodes are disposed around the circular electrode, it becomes easy to increase a light output while reducing a light amount cut-off by the electrode.

Figure 2A:
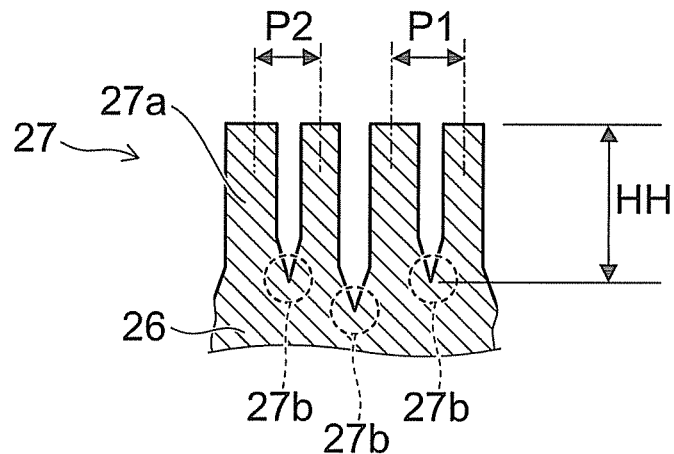
FIG. 2A is a schematic cross-sectional view partially enlarging island-like convex portions.
Figure 2B:
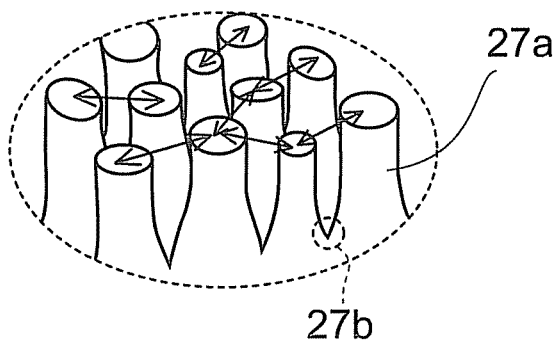
FIG. 2B is a schematic partial perspective view of the island-like convex portions.
Figure 2C:
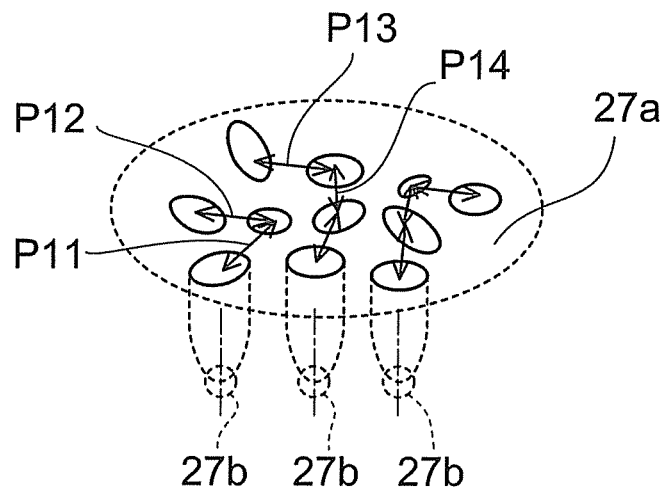
FIG. 2C is a schematic partial perspective view of mesh-like convex portions.

FIG. 2A is a schematic cross-sectional view partially enlarging island-like convex portions, FIG. 2B is a schematic partial perspective view of the island-like convex portions, and FIG. 2C is a schematic partial perspective view of mesh-like convex portions.

In FIGS. 2A and 2B, the concave-convex structures 27 include island-like convex portions 27a and bottom portions 27b provided around the convex portions 27a. The thickness of the surface processed layer 26b is larger than the height HH of the convex portions 27a and configured to cause the bottom portions 27b not to reach the second layer 25. Alternatively, the bottom portions 27b may be configured not to penetrate through the second layer 25.

In the case where the convex portions 27a are formed by multiple islands, a minimum distance among the distances from one island to the surrounded islands is denoted by a pitch P1, P2, or the like. In the case where the shape of the island is random, the island is replaced by a circle having the same area and the distance is defined as a distance between the centers thereof. An average value of the pitches is defined as an average pitch of the island-like convex portions 27a. Further, in the case where the convex portions 27a are mesh-like as shown in FIG. 2C, a minimum distance among the distances from the center of one bottom portion 27b provided adjacent to the convex portions 27a to the centers of the surrounding bottom portions 27b is denoted as a pitch P11, P12, P13, P14, or the like. In this manner, an average value of the pitches is defined as an average pitch of the mesh-like convex portions 27a.

In the case where the outside refractive index is lower than the refractive index of the current spreading layer 26, the refractive index of the current spreading layer 26, which is provided with the convex portions 27a, has a graded refractive index in which the refractive index reduces from the refractive index of the current spreading layer 26 toward the outside refractive index. Thereby, it is possible to increase the light extraction efficiency. Further, when the average pitch is made not more than the wavelength of the emission light, the convex portions 27a works as a grating and a part of n-order diffraction light (n=±1, ±2, . . . ) can be extracted, and it is possible to further increase the light extraction efficiency.

Next, a formation process of the concave-convex structures 27 will be explained. Each of the current spreading layer 26, the cladding layer 24, and the light emitting layer 22 is assumed to be made of $In_x(Ga_yAl_{1-y})_{1-x}P$ ($0 \leq x \leq 1$ and $0 \leq y \leq 1$). Further, the first layer 26a and the surface processed layer 26b are assumed to be represented by the same composition formula.

The convex portions 27a having an average pitch smaller than the wavelength of the emission light can be formed by the dry etching method such as RIE using a self-organized pattern of a block copolymer as a mask, for example.

First, the block copolymer can be prepared by mixing polystyrene (PS)/polymethyl-methacrylate (PMMA) and PMMA homopolymer in equal amounts, for example and blending in a solvent of PS homopolymer and propylene-glycol-monoether-acetate (PGMEA). After the block copolymer is coated on a wafer in a uniform thickness by using a spin coater, for example, heat treatment such as baking and annealing is carried out. As a result, phase separation is caused between the PS and the PMMA. That is, the PS and the PMMA are aggregated in a self-organized manner and a particle-shaped PS layer is formed.

In this case, by changing a composition ratio between the PS and the PMMA, it is possible to change a particle diameter, a particle occupation rate, etc. of the PS layer. The RIE is carried out subsequently, and the PMMA is removed by selective etching. The PS layer remains as the convex portions 27a having an average pitch in a range of 10 nm to 300 nm, for example. Further, an $SiO_2$ film mask, for example, is made using the PS layer pattern as a mask, and the desired convex portions 27a can be formed by the dry etching method using the $SiO_2$ film as a mask. Here, the dry etching method may be carried out by using a resist pattern as the mask.

When the dry etching method is used, a halogen ion and a hydrogen ion which are used as ion species remain easily in the surface processed layer 26b. The ions of these elements can move by an electric field applied for operation. For example, when the current spreading layer 26 is an n-type, a negative ion such as $Cl^-$, $Br^-$, $I^-$ and $F^-$ tends to move toward a positive side. Also in the case where a solution etching method is used and halogen and the like is included in an etchant, an ion sometimes remains, but the influence thereof is reduced by the embodiment.

Figure 3:
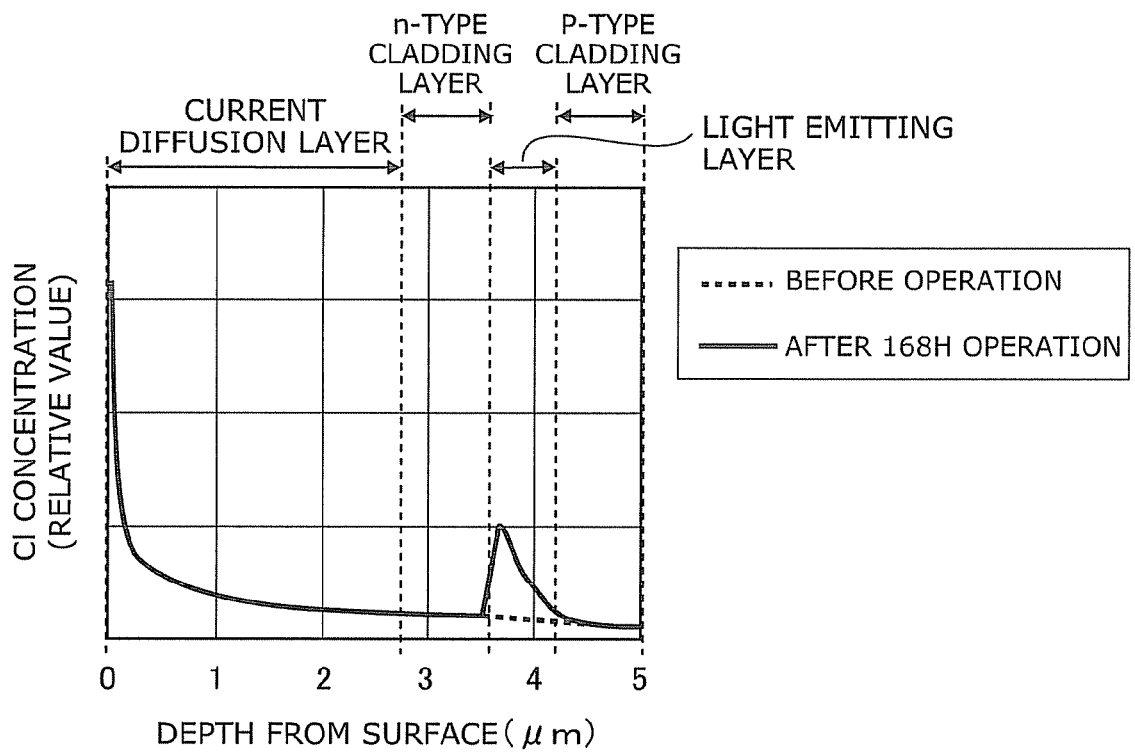
FIG. 3 is a graph showing an analysis result using SIMS of a Cl concentration.

FIG. 3 is a graph showing an analysis result using SIMS of a Cl concentration.

The inventors applied a voltage to a light emitting element, which did not have the high concentration second layer in the n-type current spreading layer, and compared Cl concentration changes. The vertical axis shows a relative Cl concentration, and the horizontal axis is a depth (μm) from the surface. The broken line and the solid line show relative Cl concentration before operation and after 168 hour operation, respectively.

According to the result of the analysis using the SIMS (Secondary Ion Mass Spectroscopy), Cl was piled up within the p-type light emitting layer after a drive current of 50 mA has been injected for 168 hours, for example. If a p-type impurity concentration is sufficiently low in the light emitting layer or in a non-doped case, a negative ion is trapped also on the p-type cladding layer side. In this manner, by using the SIMS, it is possible to detect a slight amount of the Cl pile up in a high sensitivity. The Cl trapped in the light emitting layer induces crystal defects and the like inside the light emitting layer 22 and causes non-radiative recombination. These crystal defects are further spread within the light emitting layer by the driving current and degrade the light output much more. According to the experiment by the inventors, it has been found that the light output is sometimes degraded down to 40 to 60% in average after 1000 hour operation.

Figure 4:
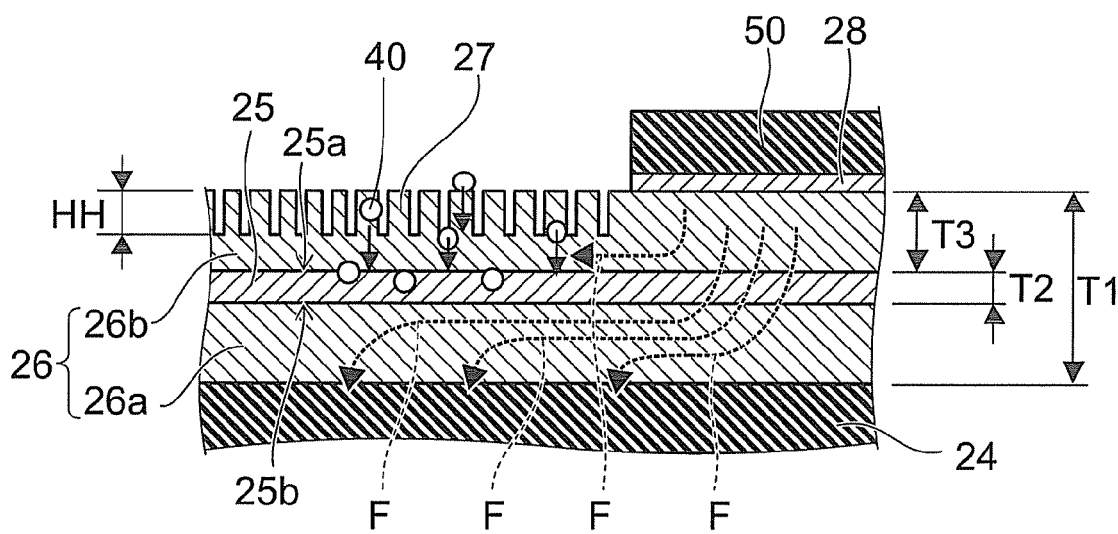
FIG. 4 is a schematic partial cross-sectional view explaining that a second layer blocks a negative ion in the first embodiment.

FIG. 4 is a schematic partial cross-sectional view explaining that the second layer blocks an ion in the first embodiment.

In this drawing, each of the light emitting layer 22, the cladding layer 24, the current spreading layer 26, and the second layer 25 (thickness T2) is assumed to be made of $In_x(Ga_yAl_{1-y})_{1-x}P$ ($0 \leq x \leq 1$ and $0 \leq y \leq 1$). Further, each of the cladding layer 24, the current spreading layer 26, and the second layer 25 is assumed to have an n-type conductivity type.

In the case where the semiconductor material of $In_x(Ga_yAl_{1-y})_{1-x}P$ (here, $0 \leq x \leq 1$ and $0 \leq y \leq 1$) is processed by the RIE method, a reactive species includes a negative ion such as $Cl^-$, $Br^-$, $I^-$ and $F^-$ and a positive ion such as $H^+$. These ions 40 are accelerated to intrude into the surface processed layer 26b (thickness T3) or adhere to the concave-convex structures 27. A halogen and a hydrogen ion have a high reactivity and easily move by the applied voltage or the like.

The Cl ion 40 tends to move toward the second (p-side) electrode, but is decelerated by a majority carrier (electron) which is generated in the second layer 25 having a high impurity concentration, and trapped in the second layer 25. Accordingly, a movement of the Cl ion 40 is suppressed toward the cladding layer 24. Therefore, it is difficult that the Cl ions reach the light emitting layer 22. In this manner, the second layer 25 functions as a negative ion blocking layer.

The inventors have found that the negative ion is more securely trapped when the second layer 25 is configured to have a peak n-type impurity concentration not less than $5\times10^{18}$ cm$^{-3}$ and a thickness T2 not more than 100 nm. On the other hand, when the impurity concentration becomes higher than $1\times10^{19}$ cm$^{-3}$, light absorption increases and the output decreases abruptly. Further, also when the thickness T2 of the second layer 25 becomes larger than 100 nm, the light absorption increases and the output decreases. That is, it is preferable to suppress the light absorption by making the thickness T2 not more than 100 nm while keeping the peak n-type impurity concentration not less than $5\times10^{18}$ cm$^{-3}$ which is a peak impurity concentration where the negative ion is easily trapped. Further, when the second layer 25 is formed as an n-type Δ (delta)doped layer having a sheet concentration in a range between $5\times10^{12}$ cm$^{-2}$ and $1.5\times10^{13}$ cm$^{-2}$, inclusive, it is possible to obtain a steep profile and to enhance the negative ion trap effect.

When the impurity concentration of the current spreading layer 26 is set to not more than $3\times10^{18}$ cm$^{-3}$, it is possible to reduce the light absorption. In the case where the distance from the surface of the surface processed layer 26b to the cladding layer 24 is denoted by T1 and the thickness of (T1−T2) is set to not less than 2 μm, the current is easily spread in the plane of the light emitting layer 22. However, when the thickness is set to not less than 5 μm, the quality of the crystal growth film is degraded by the increase of the crystal defects and the like, and the light output decreases. In the embodiment, the thickness T2 of the high concentration region which increases the light absorption is decreased to not more than 100 nm, and thereby it is possible to decrease the thickness of the current spreading layer 26 (T1−T2) to not more than 5 μm while keeping a high ion-movement blocking effect and a high current spreading effect.

The cladding layer 24, the current spreading layer 26, and the second layer 25 can also have a p-type conductivity type. In the case where the semiconductor material of $In_x(Ga_yAl_{1-y})_{1-x}P$ (here, $0\leq x\leq1$ and $0\leq y\leq1$) is processed by the RIE method, a positive ion such as H$^+$ can also be used as the reactive species. The positive ion is accelerated to intrude into the surface processed layer 26b or adhere to the concave-convex structures 27. Such a positive ion has a high reactivity and tends to move to a negative electrode side by the current application.

A hydrogen ion tends to move toward the n-side electrode, but is decelerated by a majority carrier (hole) which is generated in the second layer 25 having a high impurity concentration, and trapped in the second layer 25. Accordingly, the hydrogen ion movement is suppressed toward the cladding layer 24. Therefore, it is difficult that the hydrogen ions reach the light emitting layer 22. In this manner, the second layer 25 functions as a positive ion blocking layer.

In this case, when the second layer 25 is configured to have a p-type impurity concentration higher than the p-type impurity concentration of the current spreading layer 26, it is possible to trap the positive ion more securely. Further, it is also possible to securely trap the positive ion when the dopant of the current spreading layer 26 and the dopant of the second layer 25 are configured to be different from each other in at least one element.

In FIG. 4, the current spreading layer 26 is assumed to be made of $In_{0.5}(Ga_{0.7}Al_{0.3})_{0.5}P$ (impurity concentration: not less than $5\times10^{17}$ cm$^{-3}$). The cladding layer 24 is assumed to be made of $In_{0.5}Al_{0.5}P$ (impurity concentration: $4\times10^{17}$ cm$^{-3}$ and thickness: 0.6 μm). The contact layer 28 is assumed to be made of GaAs (impurity concentration: $1.0\times10^{18}$ cm$^{-3}$ and thickness: 0.1 μm). Further, the height HH of the convex portions 27b is assumed to be 0.5 μm or the like, for example. When a forward voltage is applied to the p-n junction and a carrier is injected from the electrode 50, the flow F of the carrier is spread in the current spreading layer 26 and spread in the plane of the light emitting layer 22 via the cladding layer 24.

The light emitting layer 22 can have an MQW (Multi Quantum Well) structure including a well layer made of $In_{0.5}(Ga_{0.9}Al_{0.1})_{0.5}P$ (thickness: 8 nm) and a barrier layer made of $In_{0.5}(Ga_{0.4}Al_{0.6})_{0.5}P$ (thickness: 5 nm). Here, the number of wells is configured to be in a range of 30 to 60, for example. Thereby, it becomes possible to emit visible light having a wavelength range of 530 to 700 nm.

On the other hand, each of the light emitting layer 22, the cladding layer 24, the current spreading layer 26, and the second layer 25 is configured to be made of $In_x(Ga_{1-y}Al_y)_{1-x}P$ ($0\leq x\leq1$ and $0\leq y\leq1$). The dopant of the current spreading layer 26 and the dopant of the second layer 25 can be made different in at least one element. For example, the current spreading layer 26 is configured to include Si as a donor (dopant) and the second layer 25 is configured to include one of C, Sn, and Ge as a donor (dopant). When a dopant element is selected appropriately, sometimes coupling with a halogen ion is enhanced and the ion is securely trapped. In this case, when the impurity concentration of the second layer 25 is made higher than the impurity concentration of the current spreading layer 26, the ion can be trapped further securely. The dopant of the current spreading layer 26 may include two or more elements. Further, the dopant of the second layer 25 may include two or more elements.

Further, the second layer 25 may be provided in the first layer 26a, made of a constituent element different from the constituent element of the current spreading layer 26, and configured to have an impurity concentration of the first conductivity type not lower than the impurity concentration of the current spreading layer 26. For example, the light emitting layer 22 and the cladding layer 24 are configured to include constituent elements represented in a composition formula of $In_x(Ga_{1-y}Al_y)_{1-x}P$ ($0\leq x\leq1$ and $0\leq y\leq1$). Further, the current spreading layer 26 is configured to include constituent elements represented in a composition formula of $In_x(Ga_{1-y}Al_y)_{1-x}P$ ($0\leq x\leq1$ and $0\leq y\leq1$). The second layer 25 can be made of one of $Al_xGa_{1-x}As$ ($0\leq x\leq1$), GaAs, GaP, and $In_x(Ga_{1-y}Al_y)_{1-x}P$ ($0\leq x\leq1$ and $0\leq y\leq1$) and also include a constituent element different from the constituent element of the current spreading layer 26.

With the configuration in this manner, it is possible to trap an ion at a hetero interface across different band gaps. In this case, as the thickness T2 of the second layer 25 is made smaller, lattice matching becomes easier, and the crystalline quality of the stacked body can be improved. That is, ion movement can be suppressed by the hetero interface.

Figure 5A:
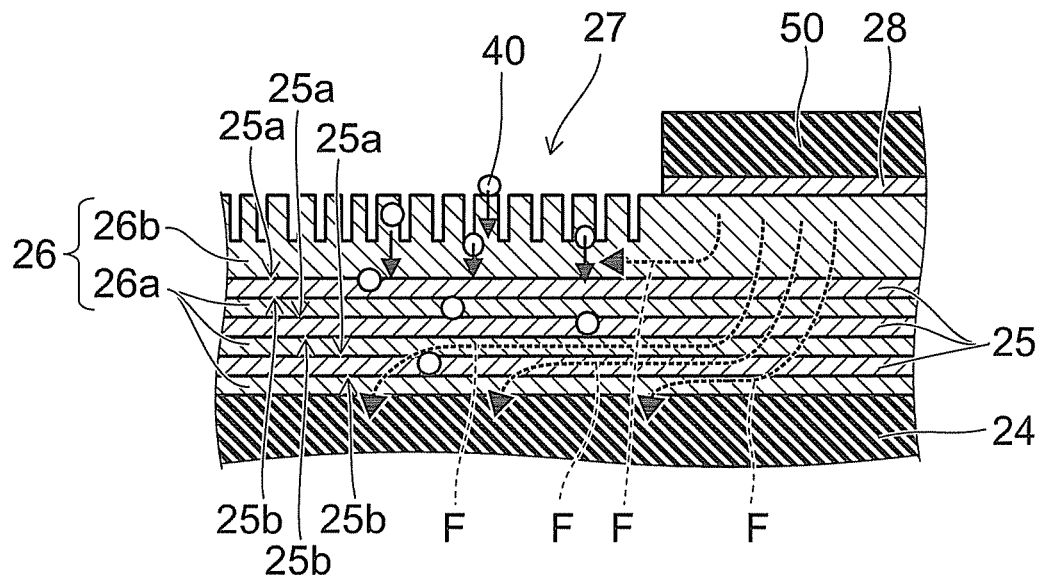
FIG. 5A is a schematic partial cross-sectional view of a light emitting element according to a second embodiment.
Figure 5B:
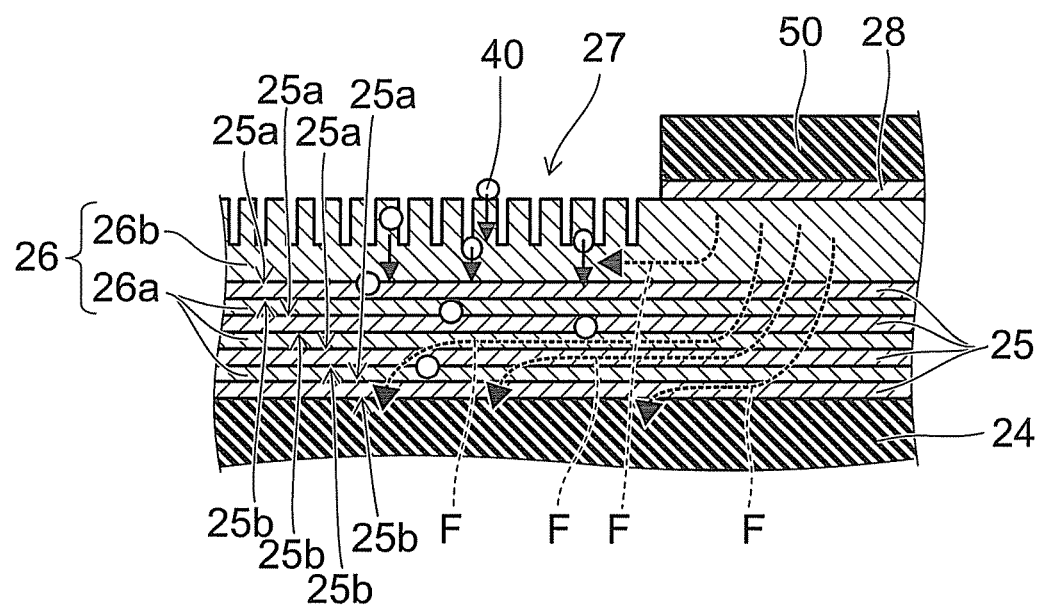
FIG. 5B is a schematic partial cross-sectional view of a variation thereof.

FIG. 5A is a schematic partial cross-sectional view of a light emitting element according to a second embodiment, and FIG. 5B is a schematic partial cross-sectional view of a variation thereof.

The second layer 25 may be plurally provided as shown in FIG. 5A. A first surface 25a of the first one of the second layers 25 contacts the surface processed layer 26b having a thickness of T3. When the second layer 25 is plurally provided in this manner, it is possible to trap a negative ion more securely. Further, as shown in FIG. 5B, a second surface 25b of the fourth one of the second layers 25 may contact the cladding layer 24. In this case, the first layer 26a includes three divided regions among the four second layers 25. Here, the second layer 25 including two or more regions can be configured with one of a region having an impurity concentration higher than the impurity concentration of the current spreading layer 26 and a region having a dopant different from the dopant of the current spreading layer 26. Further, the second layer 25 including two or more regions can be made of a constituent element different from the constituent element of the current spreading layer 26. The second layer 25 may have the p-type conductivity type to trap the positive ion.

According to the embodiments described above, light emitting elements, which improve reliability in a long-hour operation while keeping a high light output, are provided. These light emitting elements can emit light in the visible light wavelength range and can be widely used for an illumination apparatus, a display device, a traffic light, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A light emitting element, comprising:
a light emitting layer capable of emitting emission light;
a cladding layer of a first conductivity type;
a current spreading layer of the first conductivity type including a surface processed layer and a first layer, the surface processed layer having a surface including convex portions and bottom portions provided adjacent to the convex portions, the first layer being provided between the surface processed layer and the cladding layer, wherein a first impurity concentration of the first layer is the same as a second impurity concentration of the surface processed layer;
a second layer of the first conductivity type provided between the surface processed layer and the first layer, the second layer having an impurity concentration higher than a third impurity concentration of the current spreading layer; and
an electrode provided in a region of the surface of the surface processed layer where the convex portions and the bottom portions are not provided,
wherein the cladding layer, the current spreading layer, and the second layer being provided on one surface side of the light emitting layer, and
wherein the third impurity concentration of the current spreading layer is not less than $5\times10^{17}$ cm$^{-3}$ and not more than $3\times10^{18}$ cm$^{-3}$, and the third impurity concentration of the current spreading layer is greater than a fourth impurity concentration of the cladding layer.

2. The element according to claim 1, wherein the convex portions are island like or mesh-like.

3. The element according to claim 2, wherein the convex portions are configured to have an average pitch not more than a wavelength of the emission light.

4. The element according to claim 1, wherein
each of the light emitting layer, the cladding layer, the current spreading layer, and the second layer is made of $In_x(Ga_{1-y}Al_y)_{1-x}P$ ($0\leq x\leq 1$ and $0\leq y\leq 1$), and
the second layer has a peak impurity concentration not less than $5\times10^{18}$ cm$^{-3}$ and a thickness not more than 100 nm.

5. The element according to claim 1, wherein
each of the light emitting layer, the cladding layer, the current spreading layer, and the second layer is made of $In_x(Ga_{1-y}Al_y)_{1-x}P$ ($0\leq x\leq 1$ and $0\leq y\leq 1$), and
the second layer is formed as a delta-doped layer having a sheet concentration in a range between $5\times10^{12}$ cm$^{-2}$ and $1.5\times10^{13}$ cm$^{-2}$, inclusive.

6. The element according to claim 1, wherein
each of the light emitting layer, the cladding layer, the current spreading layer, and the second layer is made of $In_x(Ga_{1-y}Al_y)_{1-x}P$ ($0\leq x\leq 1$ and $0\leq y\leq 1$).

7. The element according to claim 1, wherein
a thickness of the current spreading layer is not more than 5 μm.

8. A light emitting element, comprising:
a light emitting layer capable of emitting emission light;
a cladding layer of a first conductivity type;
a current spreading layer of the first conductivity type including a surface processed layer and a first layer, the surface processed layer having a surface including convex portions and bottom portions provided adjacent to the convex portions, the first layer being provided between the surface processed layer and the cladding layer, wherein a first impurity concentration of the first layer is the same as a second impurity concentration of the surface processed layer;
a second layer of the first conductivity type provided between the surface processed layer and the first layer; and
an electrode provided in a region of the surface of the surface processed layer where the convex portions and the bottom portions are not provided,
wherein the cladding layer, the current spreading layer, and the second layer are provided on one surface side of the light emitting layer,
wherein at least one dopant included in one of the surface processed layer and the second layer is not included in the other of the surface processed layer and the second layer, a third impurity concentration of the current spreading layer is not less than $5\times10^{17}$ cm$^{3}$ and not more than $3\times10^{18}$ cm$^{-3}$, and the third impurity concentration of the current spreading layer is greater than a fourth impurity concentration of the cladding layer, and
wherein each of the light emitting layer, the cladding layer, the current spreading layer, and the second layer is made of $In_x(Ga_{1-y}Al_y)_{1-x}P$ ($0\leq x\leq 1$ and $0\leq y\leq 1$), and the second layer has a peak impurity concentration not less than $5\times10^{18}$ cm$^{-3}$ and a thickness not more than 100 nm.

9. The element according to claim 8, wherein the convex portions are island-like or mesh-like.

10. The element according to claim 9, wherein the convex portions are configured to have an average pitch not more than a wavelength of the emission light.

11. The element according to claim 8, wherein
each of the light emitting layer, the cladding layer, the current spreading layer, and the second layer is made of $In_x(Ga_{1-y}Al_y)_{1-x}P$ ($0\leq x\leq 1$ and $0\leq y\leq 1$), and
the second layer is formed as a delta-doped layer having a sheet concentration in a range between $5\times10^{12}$ cm$^{-2}$ and $1.5\times10^{13}$ cm$^{-2}$, inclusive.

12. The element according to claim 8, wherein
each of the light emitting layer, the cladding layer, the current spreading layer, and the second layer is made of $In_x(Ga_{1-y}Al_y)_{1-x}P$ ($0\leq x\leq 1$ and $0\leq y\leq 1$).

13. The element according to claim 8, wherein a thickness of the current spreading layer is not more than 5 µm.

* * * * *